US008736034B2

(12) United States Patent  
Montoriol, Jr. et al.

(10) Patent No.: US 8,736,034 B2  
(45) Date of Patent: May 27, 2014

(54) LEAD-FRAME CIRCUIT PACKAGE

(75) Inventors: Gilles Montoriol, Jr., Tournefeuille (FR); Thierry Delaunay, Tolouse (FR); Frederic Tilhac, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 996 days.

(21) Appl. No.: 11/816,038

(22) PCT Filed: Feb. 24, 2005

(86) PCT No.: PCT/IB2005/001077
§ 371 (c)(1),
(2), (4) Date: Aug. 10, 2007

(87) PCT Pub. No.: WO2006/090204
PCT Pub. Date: Aug. 31, 2006

(65) Prior Publication Data
US 2008/0142935 A1    Jun. 19, 2008

(51) Int. Cl.
*H01L 23/495* (2006.01)
(52) U.S. Cl.
USPC .......... 257/666; 257/691; 257/E23.035
(58) Field of Classification Search
USPC ................ 257/666, 691, E23.035
See application file for complete search history.

(56) References Cited

U.S. PATENT DOCUMENTS

| | | | |
|---|---|---|---|
| 5,536,906 A | | 7/1996 | Haas, Jr. et al. |
| 6,608,367 B1 * | | 8/2003 | Gibson et al. ............ 257/666 |
| 6,621,140 B1 | | 9/2003 | Gibson et al. |
| 6,750,546 B1 | | 6/2004 | Villanueva et al. |
| 7,113,054 B2 | | 9/2006 | Riondet et al. |
| 2002/0140075 A1 | | 10/2002 | Laureanti et al. |
| 2003/0209784 A1 | | 11/2003 | Schmitz et al. |
| 2004/0201423 A1 | | 10/2004 | Weigand et al. |
| 2004/0232982 A1 | | 11/2004 | Ichitsubo et al. |

FOREIGN PATENT DOCUMENTS

| | | |
|---|---|---|
| EP | 1357596 A2 | 10/2003 |
| JP | 10242377 | 9/1998 |

OTHER PUBLICATIONS

Saso et al; "0.1 CC 60% Efficiency Power Amplifier Multi-Chip Modules for Personal Digital Cellular Phones"; 1999 IEEE MTT-S Digest, pp. 1401-1404.

Bessemoulin et al; "1-Watt Ku-band Power Amplifier MMICs using Low-cost Quad-Flat Plastic Package"; 2004 IEEE MTT-S Digest, pp. 473-476.

Reidy et al; "Supercritical Silyation of Ashed Si-O-C Low-K Films to Limit Changes in Critical Dimensions"; 2004 Materials Research Society Conference Proceedings, pp. 513-517.

* cited by examiner

*Primary Examiner* — Matthew Landau
*Assistant Examiner* — Abbigale Boyle

(57) ABSTRACT

A lead-frame circuit package comprises a die and a substrate located thereon to route radio frequency signals to/from the die. The package preferably comprises an exposed pad on the die to receive a power amplifier device wherein the substrate is used to provide high-Q elements such as RF chokes on signal paths to/from the power amplifier device.

In this manner, the design benefits from the power capabilities and improved grounding of a lead-frame conductor, whilst also achieving the routeing capabilities and small scale advantages provided by a multi-layer printed circuit substrate.

18 Claims, 4 Drawing Sheets

LEAD-FRAME CIRCUIT PACKAGE

FIELD OF THE INVENTION

The preferred embodiment of the present invention relates to a lead-frame circuit package. The invention is applicable to, but not limited to, a lead-frame circuit package suitable for use with a radio frequency power amplifier module or a front-end module.

BACKGROUND OF THE INVENTION

The present invention relates to radio frequency (RF) power amplifier (PA) and front-end modules (FEM). Typical applications targeted for such technologies are cellular phones, Personal Digital assistants (PDA) and wireless connectivity applications such as Digital video Broadcast (DVB-H and DVB-T), Zigbee, wireless local area networks (WLAN) and Ultra wideband applications (UWB). The substantially high transmission power associated with RF communication (for example class 12 global system for mobile communication (GSM) or general packet radio system (GPRS) communication) where the transmit time is half of the total communication time, forces the need to dissipate the energy in a restricted area and increases the difficulty of miniaturization of the package.

A power amplifier module for amplifying RF signals includes a radio frequency amplifier including several RF transistors (PA dice) adapted to accept an input radio frequency signal, biasing signals and control signals (controller die) and to output an amplified version of the input radio frequency signal according to biasing and control signals.

The RF transistors are generally integrated in one or several integrated circuits, such as a Gallium Arsenide (GaAs) IC, Silicon BiCMOS, Silicon Germanium Hetero-junction Bi-polar Transistor, or other CMOS-based technologies. The integrated circuit also includes biasing circuitry, which provides the DC voltage or current and a control circuit allowing the control of the power delivered at the output.

The amplifier ICs are also interconnected to components such as inductors, capacitors resistors or transmission lines used for impedance matching and control of the RF transistors.

A front end module (FEM) is the association of the above power amplifier module (PA) with the matching circuits. The matching circuits are connected to the harmonic filtering circuits. The filtering circuits are connected to the antenna switch. The matching circuits can also be implemented using surface mount devices (SMDs) on any of the following:
  (i) Substrate or leads;
  (ii) Printed circuit board (PCB) tracks on or in the substrate;
  (iii) Back and forth wire-bonding between a substrate and the dice; or
  (iv) Integrated passive devices (IPD) on substrate or leads; or
  (v) Any combination of the above four implementations.

The harmonics filtering can be implemented using integrated passive devices on substrate or leads and embedded devices in the substrate. The switch uses a dedicated semiconductor process, such as GaAs, CMOS on Silicon on Insulator (SOI).

As an operating frequency increases, a transistor's characteristics change dramatically. Above 1 MHz, depending upon the transistor, the input and output impedances decrease and become increasingly more reactive. The voltage, current and power gain decrease and there is a greater tendency for signals at the output to feedback to the input through internal capacitance. This leads to a loss of power gain, which is highly undesirable.

Power gain is often used in radio frequency (RF) circuits to emphasize a difference between active and passive circuits. A passive network may have a voltage gain or a current gain, but not both at the same time.

In contrast, the majority of audio-frequency designs involve only minor changes in impedance level and very few impedance changing devices. Voltage gain is a meaningful term under such conditions. At radio frequencies, however, impedance matching is required as, impedance levels throughout a circuit change dramatically. Thus, the only true indication of how good a transistor operates is to calculate its power gain.

For power amplifiers used in RF mobile communication, the power amplifier (PA) performance is often judged based on its Power Added Efficiency (PAE), as it directly impacts, say, the mobile communication unit's talk time. It is known that PAs require excellent grounding in order to obtain an optimum performance in PAE, as well as in gain and output power.

In a dual-band amplifier design, suitable for both low-band and high-band use in digital cellular communication units compliant with the Global System for Mobile (GSM) communications, a PA typically exhibits a performance of 60% PAE in the low GSM band of 850-900 MHz, and 55% PAE in the high-band (global standard) direct communication system (DCS)/personal communication system (PCS) frequencies of 1800-1900 MHz.

European Patent Application titled: "Arrangement and method for Impedance Matching" by Philippe Riondet, Gilles Montoriol, and Jacques Trichet describes a method using wire-bonding and using on chip capacitors for impedance matching of PA and FEM. A known power amplifier packaging design utilises lead-frame inductors.

As illustrated in FIG. 1, such a design 100 has only been implemented for a PA, in this case a dual-band amplifier, whereby a first amplifier 110 is designed for GSM, and a second amplifier 105 is designed for DCS-PCS operation. Furthermore, due to space constraints in being able to build an RF module using such lead-frame technology, the only other component on the die is the power amplifiers' associated control functionality 115. The whole package is configured in a 7×7 mm plastic package.

It is known that it is very difficult to implement high-Q inductors in a small size and at a low cost, as shown by the inductive tracks 120 implemented on the lead-frame package. Furthermore, implementing discrete inductors is impractical, due to the size and cost of such components. Wire bonding has also been shown to provide acceptable high-Q performance of inductors at very low cost. Notably, the lead-frame package described in U.S. Pat. No. 6,621,140 B1 has also been described as a mechanism to achieve a high-Q inductor performance, whilst focusing on achieving the best 'Q'.

U.S. Pat. No. 6,750,546 B1, by Villanueva et. al. describes an assembly process for a flip chip lead-frame package.

However, a power amplifier designer would ideally like to implement a complete front-end module. Unfortunately, the aforementioned use of high-Q lead-frame inductors 120 proposed in U.S. Pat. No. 6,621,140 B1 occupies about 40% of the PA area, thereby removing any practical possibility to implement a complete front-end module. Furthermore, due to the extensive use of inductive tracks that are required to manufacture a complete RF front-end module, a lead-frame package provides poor signal routeing capability.

PCT application—US2004/0232982 A1, by Ichitsubo et. al., describes an RF front-end module for wireless communication devices, and is notably focused on the avoidance of using a printed circuit board (PCB)/LTCC and surface mount technologies (SMTs).

However, it is noteworthy that none of the above citations adequately address the aforementioned problem of implementing a RF power module having an improved power performance. In particular, none of the above citations disclose a mechanism that improves power added efficiency, where sufficiently less die size is required to implementing high-Q components, such as inductors, capacitors and RF chokes.

In summary, a key parameter in the design of high performance power amplifiers is the quality of the grounding. Typically, the RF die grounding is realized by soldering the die 205, using tin lead solder, or gold tin eutectic solder), directly on a metallic flange heatsink 220, as illustrated in the circuit arrangement 200 of FIG. 2. The active die is operably coupled to substantially co-located PCBS 210 via wire-bonds 215. This known art allows the best thermal contact between the die active area 205 and the best electrical contact for the grounding. It is also well known that a resistive or inductive grounding of the RF power device generates fast degradation of power gain and power added efficiency.

However, a similar structure 300 is illustrated in FIG. 3, which has been widely used as a low cost structure. Here, an active die 305 is directly coupled to surface mounted components on a PCB 310 via wire-bonds 315. A primary weakness of this structure is a significantly worse grounding, as compared to the RF die grounding of soldering directly on a metallic flange as shown in FIG. 2. This remains the case even if there is a large number of via holes 320 underneath the active die 305.

Thus, a need exists for a low cost, lead-frame packaging technology that allows the PA die to exhibit an improved performance, whilst offering high routeability and ease of implementing high-Q components.

STATEMENT OF INVENTION

In accordance with aspects of the present invention, there is provided a lead-frame circuit package that comprises a multi-layered substrate therefor, a multi-layer substrate and a wireless communication unit having a lead-frame circuit package as a front-end module, as defined in the appended Claims.

Figure 1:
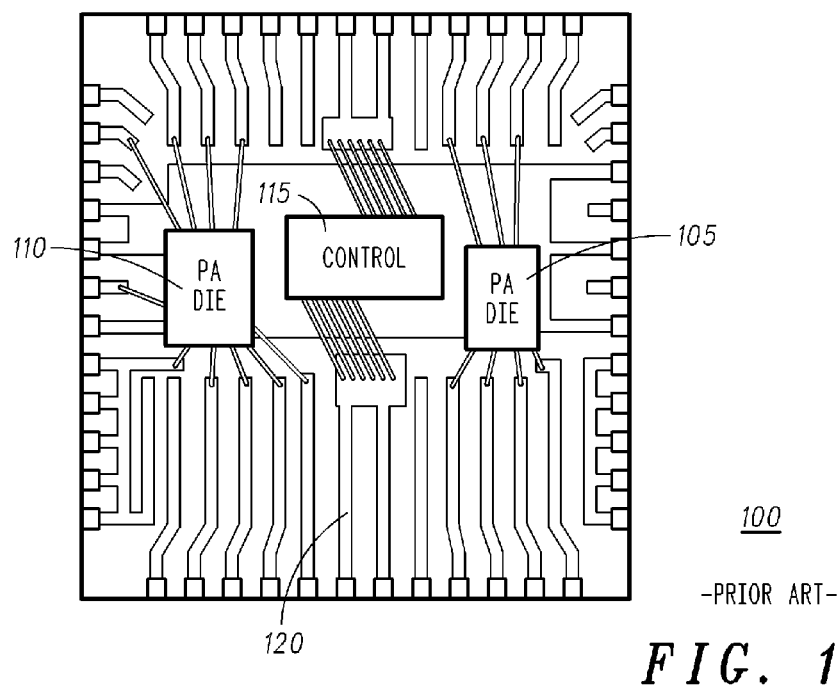
FIG. 1 illustrates a known RF power amplifier integrated circuit that uses lead-frame inductors.
Figure 2:
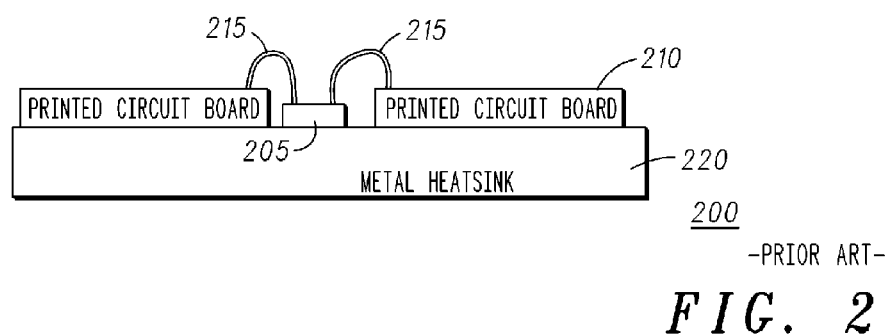
FIG. 2 illustrates a known integrated circuit structure.
Figure 3:
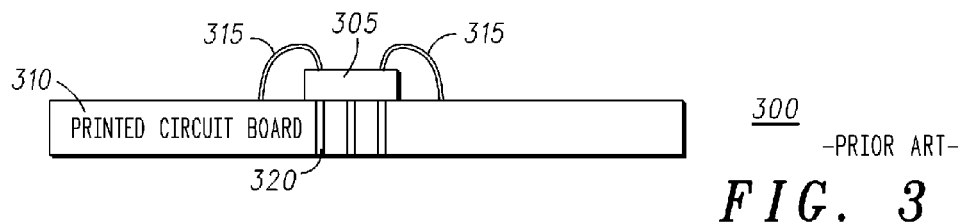
FIG. 3 illustrates a second known integrated circuit structure.
Figure 4:
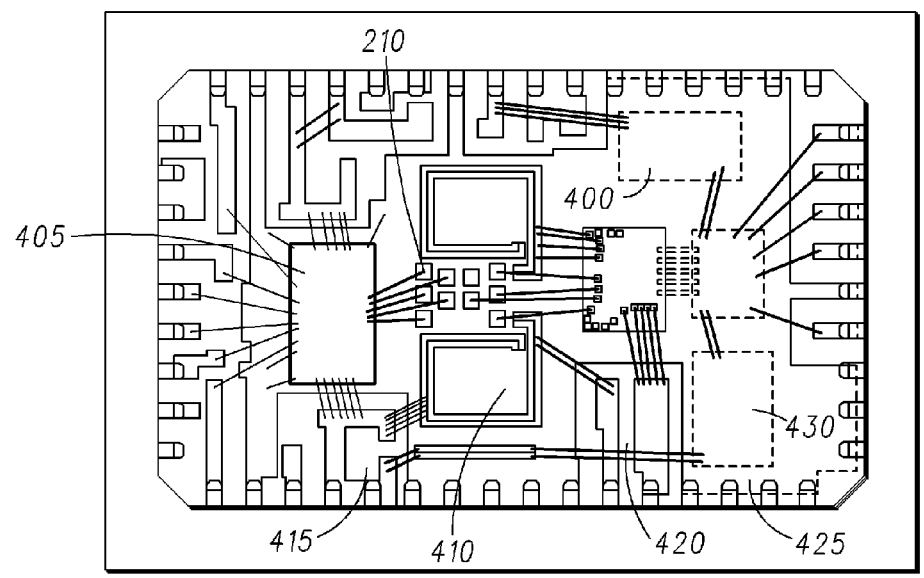
Figure 5:
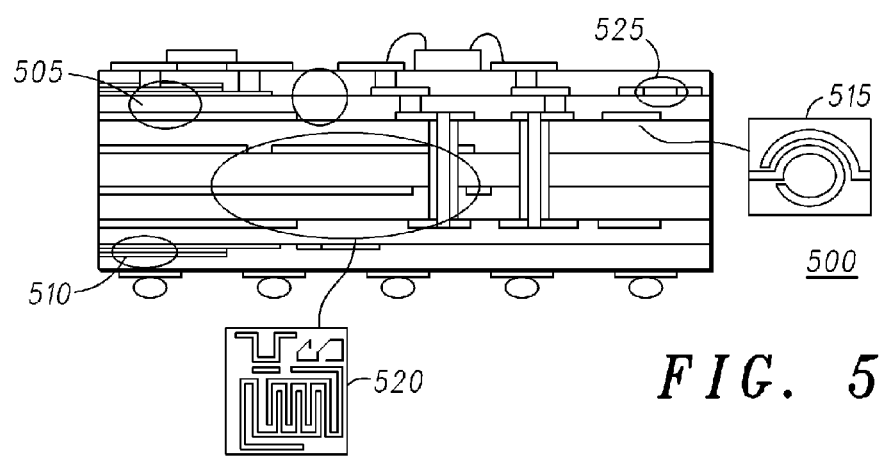
Figure 6:
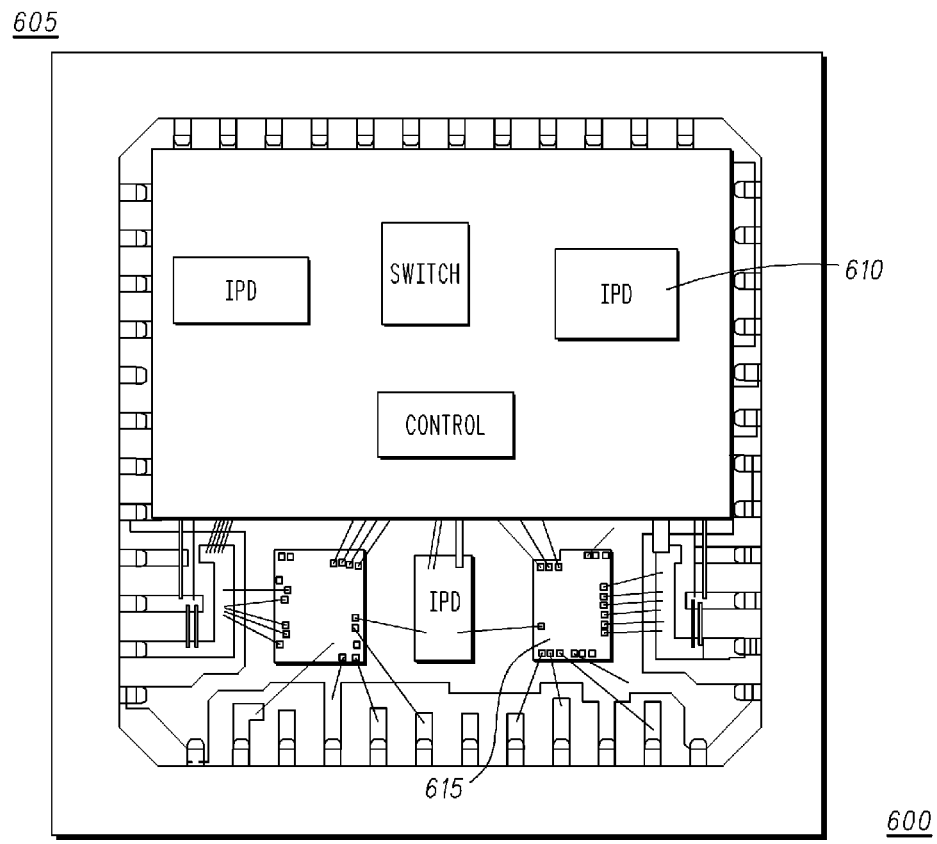
Figure 7:
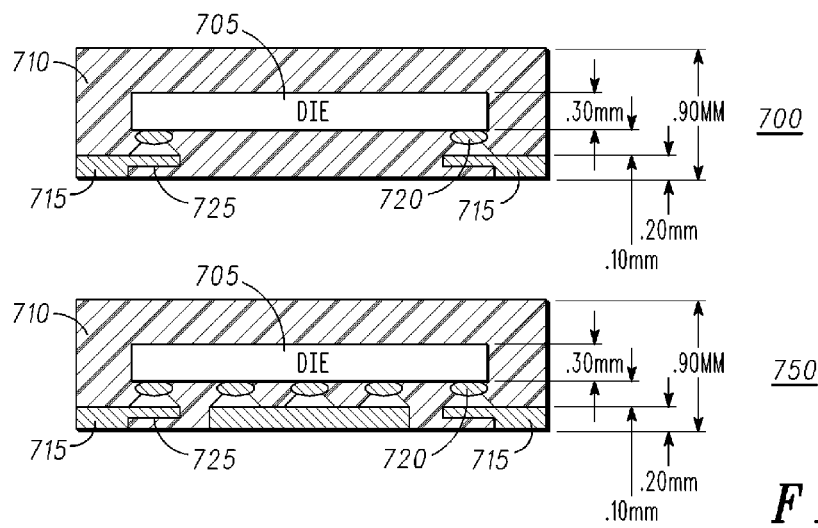
Figure 8:
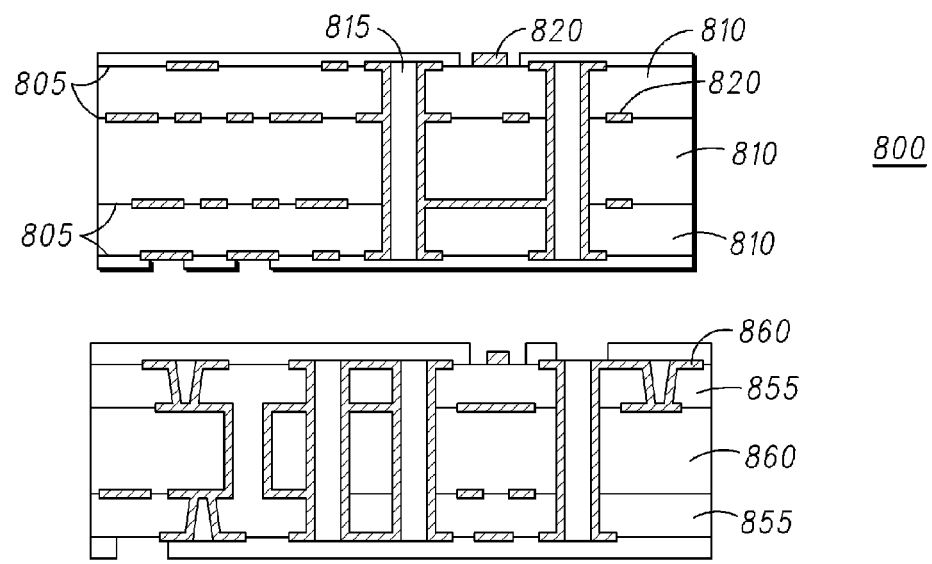
Figure 9:
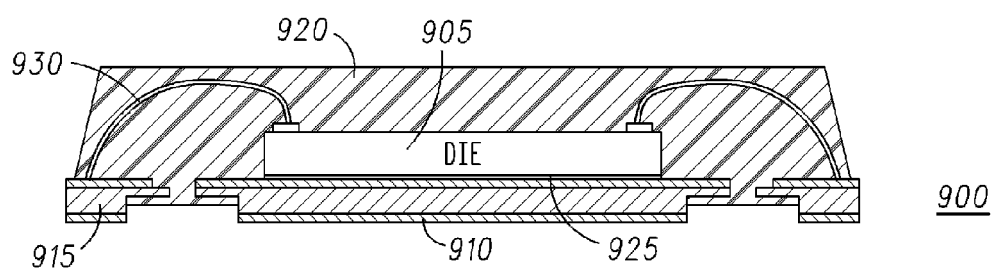

Exemplary embodiments of the present invention will now be described, by way of example only, with reference to the accompanying drawings, in which:

FIG. 4 illustrates a first example of a complete RF front-end module, utilising lead-frame technology, and constructed in accordance with the preferred embodiment of the present invention;

FIG. 5 illustrates a diagram of a multi-layer substrate employed in accordance with the preferred embodiment of the present invention;

FIG. 6 illustrates a second example of a complete RF front-end module, utilising lead-frame technology, and constructed in accordance with the preferred embodiment of the present invention;

FIG. 7 illustrates one example of an application to facilitate the lead-frame packaging, in accordance with the preferred embodiment of the present invention;

FIG. 8 illustrates a further cross-section example of a standard multi-layer substrate and a HDI substrate, adapted for use in accordance with the preferred embodiment of the present invention; and FIG. 9 illustrates a cross-section of a lead-frame package with an exposed pad, in accordance with the preferred embodiment of the present invention.

DESCRIPTION OF PREFERRED EMBODIMENTS

The preferred embodiment of the present invention will be described in terms of a lead-frame package for a radio frequency (RF) power amplifier (PA) module capable of operation in digital wireless cellular communication units, such as GSM, Edge, or $3^{rd}$ generation (3G) cellular phones. However, it will be appreciated that the inventive concepts herein described may be embodied in any radio frequency amplifier device or apparatus.

In the context of the present invention, the term 'lead-frame packaging' encompasses, at least, any metal frame that provides external electrical connection to a packaged integrated circuit (IC) or chip, as they are commonly referred to.

Furthermore, in the context of the present invention, the term 'substrate' encompasses, at least, any organic or ceramic printed circuit board (PCB) that provides internal (die to die and/or die to surface mount technology (SMT) components) and external electrical connection to the packaged chip.

It is also envisaged that a PCB may also embed some devices, such as capacitors, inductors, filters etc. Furthermore, in the context of the present invention, the term 'high density integration' (HDI), when applied to a substrate, encompasses, at least, any high density interconnect.

For a mobile communication application, where cost is a driving constraint, it is accepted that lead-frame packaging for a PA die, with a back side exposed pad, has demonstrated superior performance to the previously used multilayer substrates packages (organic or ceramic). The performance improvement in power added efficiency has been found to be between 5-7%. Thus, it is commonly accepted that a lead-frame type of package with a backside exposed pad, offers the best performance for a PA die technology.

In accordance with the preferred embodiment of the present invention, a substrate is located on a die within a lead-frame circuit package and used for several functions. The simplest function is its use in re-routeing wire-bonding from the lead-frame package to the die and/or the die to another die and/or a substrate to another substrate. Thus, any combination of routeing is envisaged within the lead-frame packaging.

In a case where the substrate is used to support die routing or having embedded components, such as capacitors or inductors located therein, a multi-layer substrate or HDI type of substrate is generally needed. It is envisaged that the substrate could be organic or ceramic.

In summary, the preferred embodiment of the present invention proposes the use of a High Density integration (HDI) printed circuit board (PCB) or Low temperature Co-fired Ceramic (LTCC) substrate inside such a lead-frame package for Radio Frequency modules/operation.

In this manner, a PA die has an improved performance using a lead-frame packaging, whilst the use of a substrate allows advantageous signal routing and increased track space to provide, for example, choke inductance. This configuration resolves the problem associated with using lead-frame packages, which are renowned as providing poor routeing capability. As such, lead-frame packages are typically unsuitable for high level integration around the PA die and consequently unsuitable for designs of complete front-end modules or complete radio modules.

Advantageously, this configuration of using a substrate on a die within a lead-frame plastic package enables the PA module to provide even more power added efficiency (PAE).

Power amplifiers (PAs) and front-end modules (FEMs) require excellent grounding for an optimum performance in PAE, and also in gain and power. In the context of the present invention, such grounding is provided by utilising lead-frame packaging.

Preferably, the lead-frame package is configured with an exposed pad that facilitates high routeing capability for 'in-package' systems. This enables a substantially equal performance for the RF power amplifier versus known prior art lead-frame packaged PAs and FEMs. The provision of a multi-layer substrate to facilitate a substantial amount of the signal routeing, as well as a number of inductive components such as RF chokes, also enables the inventive concept to be used in 'systems-in-package' type applications. Thus, and advantageously, the inventive concept of the present invention utilizes the benefits known from using multilayer substrates together with benefits provided by lead-frame technologies.

In accordance with a preferred embodiment of the present invention, a first example of a complete RF front-end module 400 is illustrated in FIG. 4. The complete RF front-end module 400 utilises lead-frame technology. In this case, and notably in accordance with the preferred embodiment of the present invention, a substrate 410 is arranged to provide a substantial number of the high-Q components. Furthermore, the substrate is arranged to sit on an exposed pad where all connections are wire bonded to the substrate.

In alternative embodiments, other means of connecting wires to the substrate may be used, such as bumped substrate or a substrate with a back side pattern, allowing back side attach with conductive glue or solder, for example tin lead solder. As soon as the substrate or PCB is bumped it can be considered as a standard bumped die and be flipped on either the lead-frame flag or the leads. A similar approach can be implemented with a back side pattern on the substrate or PCB, where solder is located similar to any dice on a lead-frame flag or leads.

RF high-Q inductors 405 are configured by using primarily wire bonds and leads to the substrate as bonding pad with tuneability. In this context, 'tuneability' means that by changing the wire-bonding length or position of some wires, the inductor can be tuned, i.e. all the parameters that will define the loop profile of the wire-bonding may be adjusted to achieve the desired performance.

In accordance with the preferred embodiment of the present invention, a HDI substrate 410 is used, in effect, as a surface mounted device (SMD) that contains, say, high-Q choke inductors and a $2^{nd}$ matching inductor for, say, a high-band PA. A HDI substrate is a multi-layer organic PCB including a thin dielectric layer (pregreg) on each side of a core dielectric layer.

A typical HDI substrate 500, adapted for use in the preferred embodiment of the present invention, is illustrated in FIG. 5. The pregreg layers preferably include small vias, generally laser drilled instead of standard mechanical drilling. The advantage of the HDI substrate is the small size that can be used for a via, enabling higher density interconnections versus the standard multi-layer PCB. Vias may be filled or not with copper to allow maximum thermal dissipation.

It is also envisaged that the HDI substrate 500 could be used to embed discrete components, such as capacitors 505, 510 and/or inductors 515 and/or filters and/or resistors 525. Such a design will facilitate easy replacement of any SMT components on either the substrate or leads, which will further decrease the package size and simplify the assembly process flow.

Referring back to FIG. 4, a PA die sits on a standard lead-frame or an exposed pad 415. It has been found that locating the PA die on an exposed pad obtains an optimal performance. The exposed pad provides excellent RF grounding of RF transistors, at low cost, whilst achieving the best power gain and PAE, as illustrated in, and described later with respect to, FIG. 9.

Another critical component in achieving a high PAE performance in PA modules is the provision of high-Q inductors and capacitors. It is proposed that high-Q surface mounted devices (SMDs) are included within the lead-frame packaging and used to provide some of the capacitors, inductors and RF chokes in the PA design. Alternatively, high-Q capacitors can be realized using Metal Insulator Metal (MIM) caps in Gallium Arsenide (GaAs).

The complete RF front-end module 400 in FIG. 4 also comprises a controller device and other front-end die components such as a harmonic filter and switch (not shown), which both are arranged to sit on the exposed pad. In FIG. 4, a die 415, including two RF amplifiers, sits on an exposed pad; together with the biasing controller die 420, two harmonic filters 425 and an antenna switch 430.

Referring now to FIG. 6, a second example of a complete RF front-end module 600 is illustrated, where the RF front-end module again utilises lead-frame technology, and is constructed in accordance with the preferred embodiment of the present invention. In this case, the multi-layer substrate is arranged to sit on exposed pad and is operably connected to the exposed pad of the PA die, via leads. A number of RF high-Q inductors 605 primarily use wire bonds to connect to the PA die, with the high-Q performance provided by routeing within the multi-layer substrate.

The HDI multi-layer substrate is preferably arranged to sit on leads using, for example, chip on leads technique (COL), as described in MicroLeadFrame® package from AMKOR™, or using flip-chip technology, as described in U.S. Pat. Nos. 6,750,546 B1 or 6,597,059 B1.

Notably, the controller and front-end die 610 of the complete RF front-end module 600 are 'flipped' on the multi-layer substrate, thereby taking advantage of the HDI routeing capability. Furthermore, in FIG. 6, the PA die 615 sits on an exposed pad for best performance. Again, non-critical SMD components are preferably included within the lead-frame packaging.

Referring now to FIG. 7, a diagram 700 of a multi-layer substrate is illustrated, that is locatable on the exposed pad of the lead-frame package, for example the lead-frame package illustrated in FIG. 4 or FIG. 6. The multi-layer substrate encompasses metal tracks to facilitate signal routeing as well as microstrip lines to simulate the characteristics of an RF choke.

Referring now to FIG. 7, one example of an application 700 to facilitate the lead-frame packaging is illustrated, that can be used to support the inventive concept hereinbefore described. The example application is an AMKOR™ packaging technology of flip chip in micro lead-frame (MLF) (fcMLF), which is appropriate for signal routeing of RF signals in RF products up to 20 GHz. Flip chip in MLF facilitates the implementation of a flip chip die PA 705 (for example a Silicon Germanium (SiGe)) that can be located close to a flip chip substrate (HDI or LTCC) that may be configured to contain a substantial portion, if not most, of the routeing tracks and/or supporting high-Q components.

The die 705 is located within a moulded plastic body 710. The die 705 is attached to a copper lead-frame 715 via high lead, tin or gold solder bumps 720. The moulded plastic body comprises half-etched areas 725.

FIG. 7 also illustrates an exposed pad version 750, wherein the application of the exposed pad version 750 using the inventive concept hereinbefore described will be understood by a skilled artisan.

Referring back to FIG. 6, one or more filters and/or the RF switch would preferably be flipped on the substrate, as shown in the example arrangement 600. In this manner, it is envisaged that a RF module could be implemented that encompasses a flip chip transceiver and a PA (wire bonded or flip chip) manufactured in SiGe or GaAs.

Advantageously, this type of implementation may remove the need for wire-bonding from the assembly process. Removing wire-bonding allows a manufacturer to decrease the die size because the bonding areas and bonding pad clearance are no longer needed. All interconnects (solder bumps) are located on chip and then the chip is flipped and soldered on with a dedicated metal pattern on the PCB.

It is advantageous to have all of the bill of material (BOM) bumped and flipped on the lead-frame, such as the: PA dice, Controller die, Harmonic filtering dice, switch die, substrate (s), thereby eliminating complex assembly processes in dealing with mixed assembly process such as wire-bonding and flip. This results in, say, a 20% cost reduction. In addition, the inventive concept benefits from a reduction in package size, which is also smaller than the mixed assembly process.

Referring now to FIG. 8, a further cross-section example of a standard multi-layer substrate 800 is illustrated, as adapted in accordance with the preferred embodiment of the present invention. The multi-layer substrate 800 is a multi-layer organic PCB including a plurality of thin dielectric layers (pregreg) 805 on each side of a plurality of core dielectric layers 810. The pregreg layers 805 preferably include small vias generated using standard mechanical drilling 815. Electrical conductors 820 are illustrated on each of the pregreg layers 805.

A further cross-section example of an HDI substrate 850 is illustrated in FIG. 8, as adapted in accordance with the preferred embodiment of the present invention. The HDI substrate 850 is a multi-layer organic PCB including a plurality of thin dielectric layers (pregreg) 855 on each side of a plurality of core dielectric layers 860. The pregreg layers 855 preferably include small vias generated using laser drilling 865. The advantage of the HDI substrate is the small size that can be used for a via, enabling higher density interconnections versus the standard multi-layer PCB.

Referring now to FIG. 9, a cross-section of a lead-frame package with an exposed pad is illustrated, in accordance with the preferred embodiment of the present invention. Here, again, the die 905 is located on the exposed die pad 910 utilising a die attach material 925. The lead-frame package comprises a copper lead-frame 915 and a moulded compound 920. Gold wire bonding 930 is used to connect the die to the lead-frame packaging.

It is also envisaged that the inventive concept of the present invention can be implemented using any active die comprising surface mount technology (SMT) components.

Furthermore, it is envisaged that the inventive concept may be implemented to use any passive substrate such as organic, LTCC, Integrated Passive Device (IPD), with or without embedded components. Typical passive devices, which include resistors, inductors, capacitors, filters and baluns, are discrete components that take up large amounts of space on a circuit board or add complexity to an RF module. In contrast Integrated Passive Devices are fabricated on a millimeter scale using volume manufacturing and assembly methods similar to silicon processes. They can be integrated directly onto a chip or module to eliminate the need for discrete devices. They offer the added advantage of lower cost and improved tolerances. Several technologies can be used such as silicon, GaAs or glass.

It is also envisaged that the inventive concept of the present invention may be utilised with any type of lead-frame package such as Quad Flat No-lead (QFN) package, Thin Quad Flat Pack (TQFP) or Small Outline (SO) package, with or without exposed pads/ flags package. A skilled artisan will also appreciate that the multi-layer substrate used in the inventive concept of the present invention can be used to route tracks between active and/or passive dice and used to support flipped or non-flipped dice as well as SMDs.

It is also envisaged that the multi-layer substrate may be arranged for use as a relay pad for High Impedance Integrated Power Amplifier (HIIPA) implementation, say using the impedance matching methods for power amplifiers as described on page 3 of U.S. Pat. No. 6,621,140 B1.

Although the preferred embodiment of the present invention has been described with reference to use of a multi-layer substrate, it is envisaged that a single-layer, high-dielectric, substrate may suffice. However, it should be noted that such substrates may be unsuitable for mobile communication applications, as low-cost substrate material that is typically required for such applications generally has a relatively low dielectric constant.

It is within the contemplation of the present invention that the inventive concept can be used in any RF module, such as a RF power amplifier or RF modem, particularly to provide a low cost RF package/ module for use in wireless communication units. Thus, it is envisaged that the inventive concept can be used within any wireless communication technology, including: digital TV (Digital Video Broadcasting (DVB) and Integrated Services Digital Broadcasting (ISDB) units) second and/or third generation (3G) cellular phones (such as $3^{rd}$ Generation Partnership Project (3GPP), Multimedia Broadcast Multicast Service (MBMS)/ High Speed Downlink Packet Access (HSDPA), 3GPP2, Bluetooth capable units, Global System for Mobile communication (GSM), RF test equipment, private mobile radio, etc.

Furthermore, it is envisaged that the inventive concept can be used in any RF module within a wireless communication unit, such as a transmitter portion adapted to transmit radio frequency signals and/or a receiver portion adapted to receive radio frequency signals utilising the aforementioned lead-frame circuit package.

It will be understood that the use of a multilayer substrate inside a lead-frame package, as described above, aims to provide at least one or more of the following advantages:

(i) The design benefits from the power capabilities and improved grounding of a lead-frame conductor, whilst also achieving the routeing capabilities provided by a multi-layer printed circuit substrate at low cost;

(ii) The advantage (around 5% in PAE for a front-end module), is almost equivalent to the increment expected moving from one technology platform (i.e. active die) to another;

(iii) It allows integration of a substantial portion of a RF front-end module on the substrate due to the substrate's routeing capability;
(iv) High-Q inductors can be implemented using SMD technology within the substrate and therefore within the lead-frame package; and
(v) Alternatively, use of metal layers of a multi-layer substrate allows high-Q inductors to be used, taking up a very small size as compared to package leads.

In particular, it is envisaged that the aforementioned inventive concept can be applied by a semiconductor manufacturer to offer both RF devices and RF packages. For example, a semiconductor manufacturer may employ the inventive concept in a design of a stand-alone RF device, such as a RF power amplifier, or application-specific integrated circuit (ASIC) and/or any other sub-system element.

Whilst the specific and preferred implementations of the embodiments of the present invention are described above, it is clear that one skilled in the art could readily apply variations and modifications of such inventive concepts.

Thus, a low cost packaging technology has been described that allows the PA die to exhibit an improved PAE performance and high routeability within a lead-frame circuit package, wherein the aforementioned disadvantages with prior art arrangements have been substantially alleviated.

The invention claimed is:

1. A lead-frame circuit package comprising:
a lead frame and a substrate located on a first side of the lead frame to route radio frequency signals to or from a power amplifier device, wherein the lead frame comprises an exposed pad located on the first side of the lead frame, the exposed pad having the power amplifier device thereon, the power amplifier device having a ground connection through to the lead-frame via a path that does not include the substrate.

2. A lead-frame circuit package according to claim 1 further characterised in that the substrate is a multi-layer substrate or high density integration substrate to support signal routing to the power amplifier device.

3. A lead-frame circuit package according to claim 1 further characterised in that the substrate supports tracks arranged to provide electrical characteristics equivalent to one or more radio frequency inductive choke(s).

4. A lead-frame circuit package according to claim 1 further characterised in that the substrate is arranged to operably couple tracks to or from the lead-frame using wire-bonding.

5. A lead-frame circuit package according to claim 1 further characterised in that the substrate is one of: organic, Low temperature Co-fired Ceramic substrate, an integrated passive device.

6. A lead-frame circuit package according to any preceding claim 1 further characterised in that the lead-frame circuit package is one of: Quad Flat No-lead package, Thin Quad Flat Pack or Small Outline package.

7. A lead-frame circuit package according to claim 1 further characterised in that the substrate is arranged to support flipped or non-flipped dice and/or surface mount devices.

8. A lead-frame circuit package according to claim 1 further characterised in that the substrate is arranged to be used as a relay pad within a high impedance integrated power amplifier implementation.

9. A lead-frame circuit package according to claim 1 configured for use as a radio module.

10. A lead-frame circuit package according to claim 1 configured for use as a radio frequency modem.

11. A substrate adapted for use with the lead-frame circuit package according to claim 1.

12. A substrate according to claim 11 wherein the substrate is a multi-layer or a high density integration substrate.

13. A lead-frame circuit package according to claim 2 further characterised in that the substrate supports tracks arranged to provide electrical characteristics equivalent to one or more radio frequency inductive choke(s).

14. A lead-frame circuit package according to claim 2 further characterised in that the substrate is arranged to operably couple tracks to or from the lead frame using wire-bonding.

15. A lead-frame circuit package according to claim 2, further characterised in that the substrate is arranged to be used as a relay pad within a high impedance integrated power amplifier implementation.

16. A lead-frame circuit package according to claim 3, further characterised in that the substrate is arranged to be used as a relay pad within a high impedance integrated power amplifier implementation.

17. A lead-frame circuit package according to claim 2 configured for use as a radio module.

18. A lead-frame circuit package according to claim 2 configured for use as a radio frequency modem.

* * * * *